United States Patent
Yamakawa et al.

(10) Patent No.: US 7,639,103 B2
(45) Date of Patent: Dec. 29, 2009

(54) PIEZOELECTRIC FILTER, ANTENNA DUPLEXER, AND COMMUNICATIONS APPARATUS EMPLOYING PIEZOELECTRIC RESONATOR

(75) Inventors: Takehiko Yamakawa, Osaka (JP); Tomohide Kamiyama, Osaka (JP); Tomohiro Iwasaki, Osaka (JP); Hiroshi Nakatsuka, Osaka (JP); Keiji Onishi, Osaka (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 11/812,013

(22) Filed: Jun. 14, 2007

(65) Prior Publication Data
US 2007/0296523 A1  Dec. 27, 2007

(30) Foreign Application Priority Data
Jun. 26, 2006  (JP) .............................. 2006-175771

(51) Int. Cl.
  H03H 9/15 (2006.01)
  H03H 9/54 (2006.01)
  H03H 9/70 (2006.01)
(52) U.S. Cl. .................. 333/133; 333/189; 310/349
(58) Field of Classification Search ......... 333/187–189, 333/133; 310/349
See application file for complete search history.

(56) References Cited

U.S. PATENT DOCUMENTS

| 6,262,637 | B1 * | 7/2001 | Bradley et al. | 333/133 |
| 6,388,544 | B1 * | 5/2002 | Ella | 333/189 |
| 6,556,103 | B2 * | 4/2003 | Shibata et al. | 333/187 |
| 6,566,979 | B2 * | 5/2003 | Larson et al. | 333/187 |
| 6,635,519 | B2 * | 10/2003 | Barber et al. | 438/151 |
| 7,271,684 | B2 * | 9/2007 | Nishihara et al. | 333/133 |
| 7,474,174 | B2 * | 1/2009 | Milsom et al. | 333/189 |
| 2006/0164187 | A1 * | 7/2006 | Hong et al. | 333/191 |
| 2007/0194863 | A1 * | 8/2007 | Shibata et al. | 333/187 |

FOREIGN PATENT DOCUMENTS

| JP | 05-183380 | | 7/1993 |
| JP | 2002-359534 | | 12/2002 |
| JP | 2004-173191 | | 6/2004 |
| JP | 2006-211644 | * | 8/2006 |

* cited by examiner

*Primary Examiner*—Barbara Summons
(74) *Attorney, Agent, or Firm*—Wenderoth, Lind & Ponack L.L.P.

(57) ABSTRACT

A piezoelectric filter comprises a substrate and a plurality of piezoelectric resonators provided on the same substrate. Each piezoelectric resonator comprises a cavity formed in the substrate, a lower electrode formed on the substrate, covering the cavity, a piezoelectric material layer formed on the lower electrode, and an upper electrode formed on the piezoelectric material layer. At least one of the piezoelectric resonators has a cavity formed of a plurality of cells.

6 Claims, 18 Drawing Sheets

F I G. 1 3  PRIOR ART
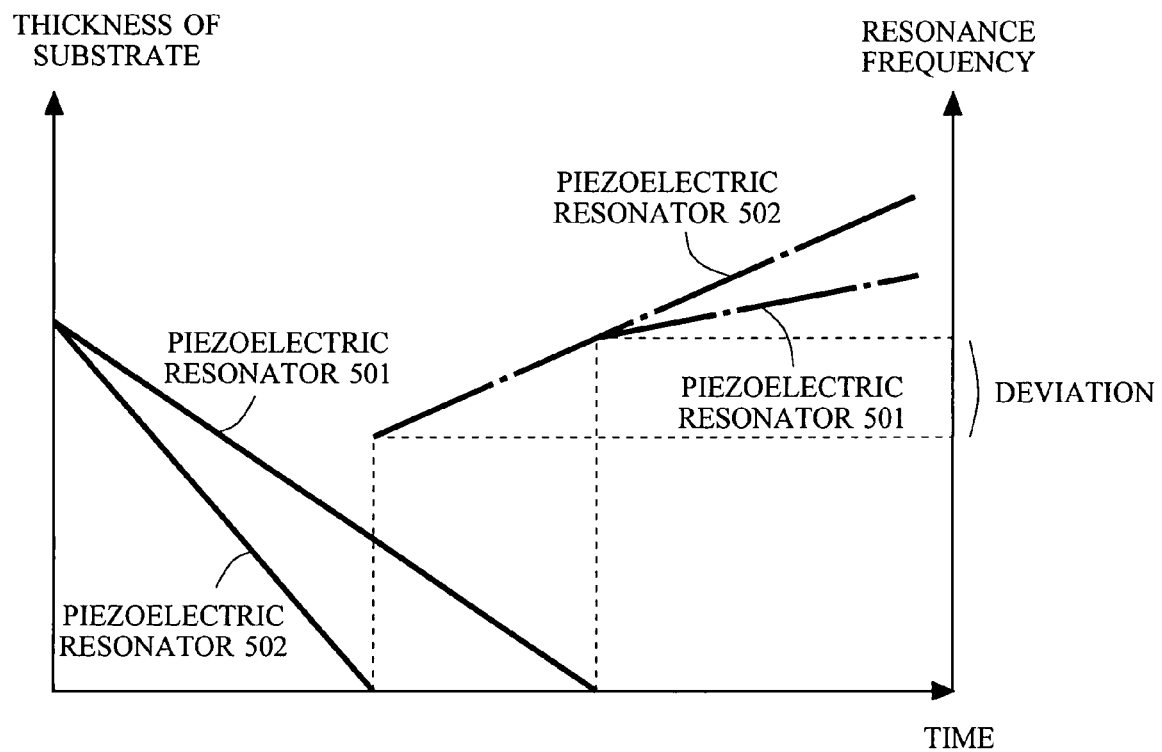

under the first background of the invention

PIEZOELECTRIC FILTER, ANTENNA DUPLEXER, AND COMMUNICATIONS APPARATUS EMPLOYING PIEZOELECTRIC RESONATOR

BACKGROUND OF THE INVENTION

1. Field of the Invention

The present invention relates to a piezoelectric filter, an antenna duplexer, and a communications apparatus employing a piezoelectric resonator for use in a wireless circuit for mobile communications, such as a mobile telephone, a wireless LAN or the like.

2. Description of the Background Art

Smaller size and lighter weight are required for parts incorporated in electronic apparatuses, such as mobile apparatuses and the like. For example, a filter or an antenna duplexer for use in a mobile apparatus needs to have small size, fine adjustment of frequency characteristics, and low insertion loss. An example of a filter satisfying such requirements is a piezoelectric filter employing a piezoelectric resonator.

FIG. 10 shows an exemplary structure of a conventional piezoelectric filter 500 employing a piezoelectric resonator. A portion (a) of FIG. 10 shows the piezoelectric filter 500 as viewed from the top. A portion (b) of FIG. 10 shows a cross-sectional view of the piezoelectric filter 500, taken along line E-E. A portion (c) of FIG. 10 shows the piezoelectric filter 500 as viewed from the bottom.

In FIG. 10, a first piezoelectric resonator 501 and a second piezoelectric resonator 502 are formed on the same substrate 503. The first piezoelectric resonator 501 is formed by successively providing a lower electrode layer 506a, a piezoelectric material layer 507a, an upper electrode layer 508a, and a frequency adjustment layer 509a via an insulating layer 505 on a first cavity 504a provided in the substrate 503. Similarly, the second piezoelectric resonator 502 is formed by successively providing a lower electrode layer 506b, a piezoelectric material layer 507b, an upper electrode layer 508b, and a frequency adjustment layer 509b via the insulating layer 505 on a second cavity 504b which is provided in the substrate 503. The second cavity 504b has a larger diameter than that of the first cavity 504a.

In each of the first piezoelectric resonator 501 and the second piezoelectric resonator 502, by applying electric field between the upper electrode layer 508 and the lower electrode layer 506, the piezoelectric material layer 507 is polarized and distorted, thereby producing mechanical resonance, which is electrically taken out (a function of the resonator). The resonance frequencies of the first piezoelectric resonator 501 and the second piezoelectric resonator 502 are mainly determined, depending on the material, film thickness, and mass loading effect of a vibration section comprised of the frequency adjustment layer 509, the upper electrode layer 508, the piezoelectric material layer 507, the lower electrode layer 506, and the insulating layer 505. If the frequency adjustment layer 509a corresponding to the first piezoelectric resonator and the frequency adjustment layer 509b corresponding to the second piezoelectric resonator have different thicknesses, i.e., one of the frequency adjustment layers 509 is thinner than the other, two piezoelectric resonators having different resonance frequencies can be formed on the same substrate 503.

Note that the different thicknesses of the frequency adjustment layers 509 are provided by using a photolithography technique which typically includes the steps of designing a mask having a portion to be removed and a portion to be left, applying resist, exposing using the designed mask, developing, etching, and removing the resist. See, for example, Japanese Laid-Open Patent Publication No. 2002-359534.

FIG. 11 is a diagram showing an exemplary conventional piezoelectric filter circuit 900 employing a piezoelectric resonator.

In FIG. 11, the conventional the piezoelectric filter circuit 900 comprises series piezoelectric resonators 904a to 904c, parallel piezoelectric resonators 903a to 903d, parallel inductors 905a to 905d, and series inductors 906a and 906b. The series piezoelectric resonators 904a to 904c are connected in series via the series inductors 906a and 906b between an input terminal 902a and an output terminal 902b. The parallel piezoelectric resonators 903a to 903d have first electrodes which are connected to respective connection points between each of the series inductors 906a and 906b and the series piezoelectric resonators 904a to 904c, which are connected in series. The parallel piezoelectric resonators 903a to 903d also have second electrodes which are grounded via the parallel inductors 905a to 905d, respectively.

A portion (a) of FIG. 12 is a diagram showing characteristics of a conventional piezoelectric resonator when used singly. A portion (b) of FIG. 12 is a diagram showing pass characteristics of a conventional piezoelectric filter. The parallel piezoelectric resonators 903a to 903d and the series piezoelectric resonators 904a to 904c theoretically have characteristics which have resonance points 1003 and 1005 where impedance is 0 and antiresonance points 1004 and 1006 where impedance is infinite, respectively. In the portion (a) of FIG. 10, a solid line indicates the characteristics of the parallel piezoelectric resonators 903a to 903d when used singly, and a dashed line indicates the characteristics of the series piezoelectric resonators 904a to 904c when used singly. A difference Δf between the resonance frequency at the resonance point and the antiresonance frequency at the antiresonance point is typically substantially determined based on the piezoelectric material included in the piezoelectric resonator. The piezoelectric filter circuit 900 is configured as follows. The antiresonance point 1004 of the parallel piezoelectric resonators 903a to 903d and the resonance point 1005 of the series piezoelectric resonators 904a to 904c are caused to substantially coincide with each other. The piezoelectric resonators are arranged in a ladder pattern. The parallel inductors 905 and the series inductors 906, which are connected to parasitic inductors and external circuits, are provided.

Thereby, the piezoelectric filter circuit 900 operates as a filter having characteristics which have a lower attenuation pole 1009 (on the lower side of a pass band 1008) at a frequency corresponding to the resonance point 1003 of the parallel piezoelectric resonators 903a to 903d, and a higher attenuation pole 1010 (on the higher side of the pass band 1008) at a frequency corresponding to the antiresonance point 1006 of the series piezoelectric resonators 904a to 904c. See, for example, Japanese Patent No. 2800905.

Note that the first piezoelectric resonator 501 having a high resonance frequency of FIG. 10 corresponds to the series piezoelectric resonators 904a to 904c of FIG. 11, while the second piezoelectric resonator 502 having a low resonance frequency corresponds to the parallel piezoelectric resonators 903a to 903d of FIG. 11.

However, in the above-described conventional filter structure, the cavity 504b of the second piezoelectric resonator 502 having a low impedance has a larger opening area than that of the cavity 504a of the first piezoelectric resonator 501 having a high impedance. Therefore, in the step of etching the substrate 503, reactive gas is more circulated in the cavity 504b having the larger opening area, so that etching proceeds faster in the cavity 504b than in the cavity 504a. Therefore, when etching is performed until the resonance frequency of the first piezoelectric resonator 501 is secured, the cavity 504b of the second piezoelectric resonator 502 penetrates through the substrate 503 to reach the insulating layer 505 (overetching). As a result, the resonance frequency of the second piezoelectric resonator 502 becomes higher than the desired resonance frequency (see FIG. 13).

Therefore, in order to secure the desired resonance frequency of the second piezoelectric resonator 502, the frequency adjustment layer 509b needs to be formed thicker by an amount corresponding to the influence of overetching (see the portion (b) of FIG. 10). However, an increase in the thickness of the frequency adjustment layer 509b leads to a deterioration in a Q value representing the performance of the piezoelectric resonator, and further, a deterioration in the insertion loss of the piezoelectric filter.

SUMMARY OF THE INVENTION

Therefore, an object of the present invention is to provide a piezoelectric filter in which a high-impedance piezoelectric resonator and a low-impedance piezoelectric resonator are formed on the same substrate while a frequency adjustment layer has a reduced thickness, a high Q value is achieved, and insertion loss is reduced, and an antenna duplexer and a communications apparatus which employ the piezoelectric filter.

The present invention is directed to a piezoelectric filter comprising a substrate and a plurality of piezoelectric resonators provided on the same substrate. To achieve the above-described object, in the piezoelectric filter of the present invention, the plurality of piezoelectric resonators each comprises a cavity formed in the substrate, a lower electrode formed on the substrate, covering the cavity, a piezoelectric material layer formed on the lower electrode, and an upper electrode formed on the piezoelectric material layer. At least one of the plurality of piezoelectric resonators has a cavity formed of a plurality of cells.

Preferably, the plurality of cells have opening portions in a surface of the substrate, and the opening portions have all the same shape and dimensions. Particularly, the opening portion in the substrate surface of each of the plurality of cells may have the same shape and dimensions as those of the cavity of another piezoelectric resonator. Also, the piezoelectric resonator having the cavity formed of the plurality of cells desirably has a lower impedance than that of another piezoelectric resonator. Also, typically, the cavities each penetrate through the substrate. In this case, the cavity formed of the plurality of cells may be divided into n cells in a bottom surface of the substrate and may be divided into less than n cells in a surface closer to the lower electrode.

The above-described piezoelectric filter can be employed as at least one of a transmission filter and a reception filter. Also, a communications apparatus can be implemented by providing an antenna duplexer employing the piezoelectric filter provided between an antenna, and a transmission device and a reception device.

According to the present invention, it is possible to provide a piezoelectric filter in which a high-impedance piezoelectric resonator and a low-impedance piezoelectric resonator are formed on the same substrate while a frequency adjustment layer has a reduced thickness, a high Q value is achieved, and insertion loss is reduced, and an antenna duplexer and a communications apparatus which employ the piezoelectric filter.

These and other objects, features, aspects and advantages of the present invention will become more apparent from the following detailed description of the present invention when taken in conjunction with the accompanying drawings.

BRIEF DESCRIPTION OF THE DRAWINGS

FIG. 13 is a diagram showing changes in a thickness of a substrate 503 and a resonance frequency of the piezoelectric filter 500.

DESCRIPTION OF THE PREFERRED EMBODIMENTS

Hereinafter, embodiments of the present invention will be described with reference to the accompanying drawings.

First Embodiment

Figure 1:
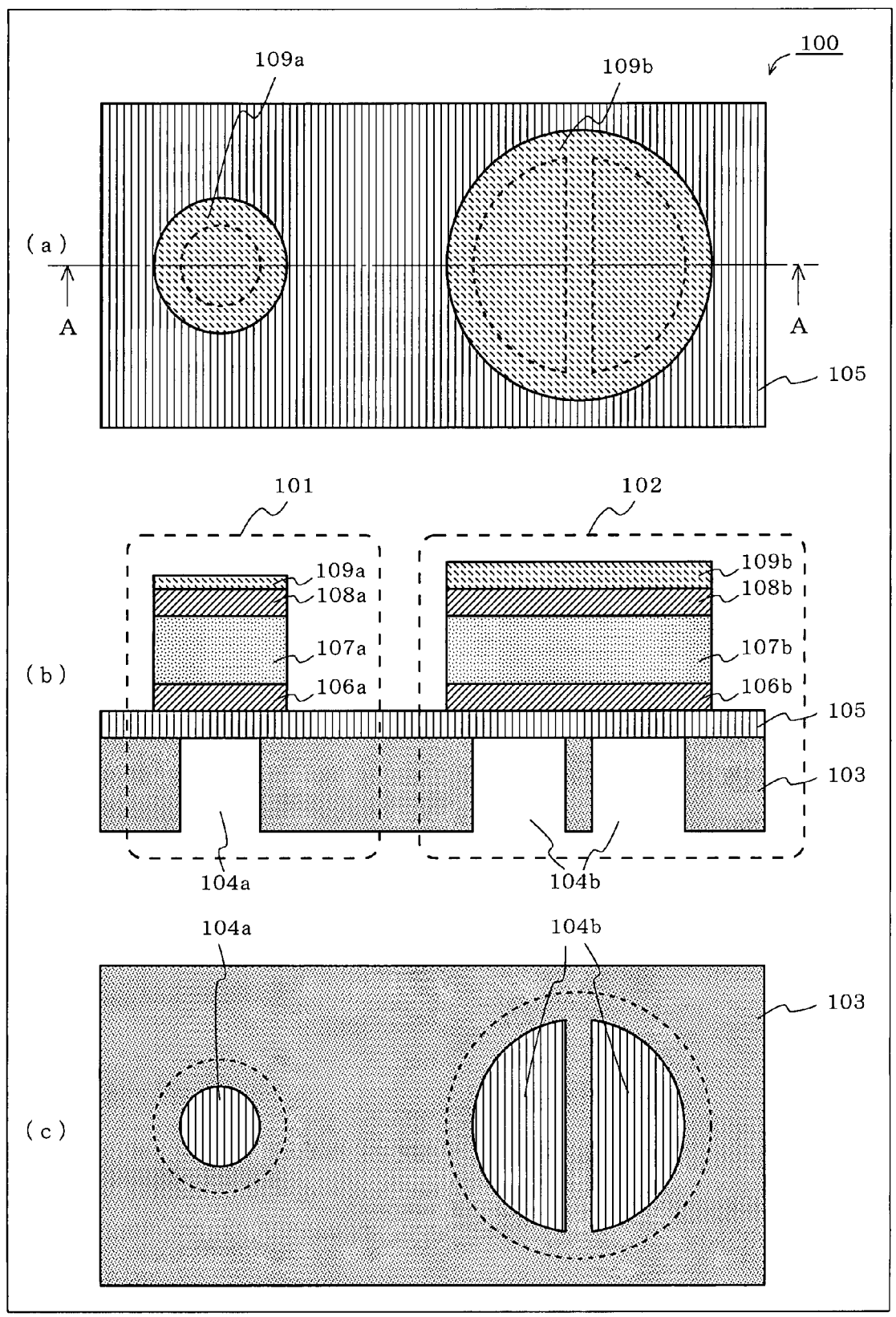
FIG. 1 is a diagram showing a structure of a piezoelectric filter 100 employing a piezoelectric resonator according to a first embodiment of the present invention.
Figure 2A:
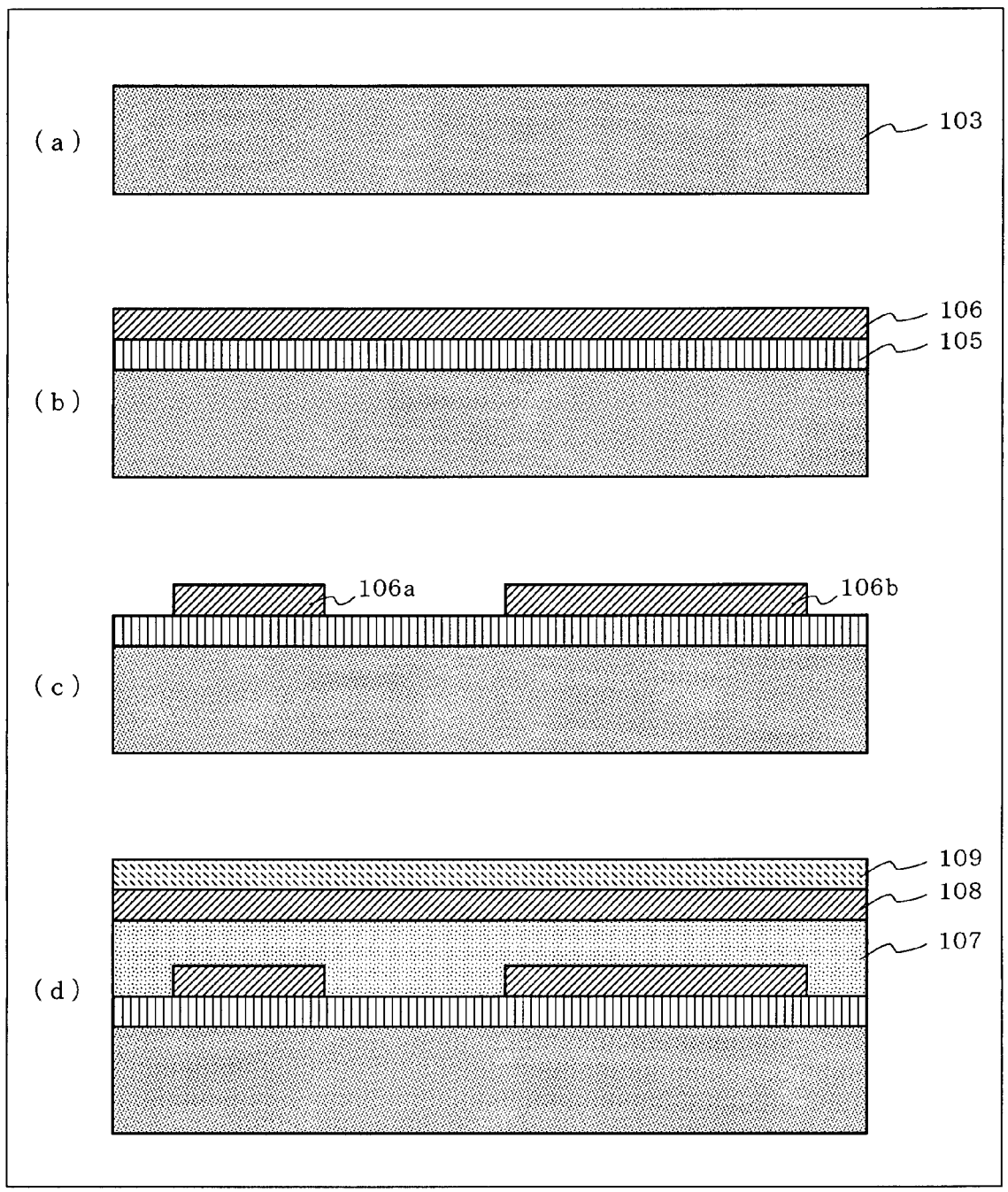
FIGS. 2A and 2B are diagrams schematically showing a method for producing the piezoelectric filter 100.
Figure 2B:
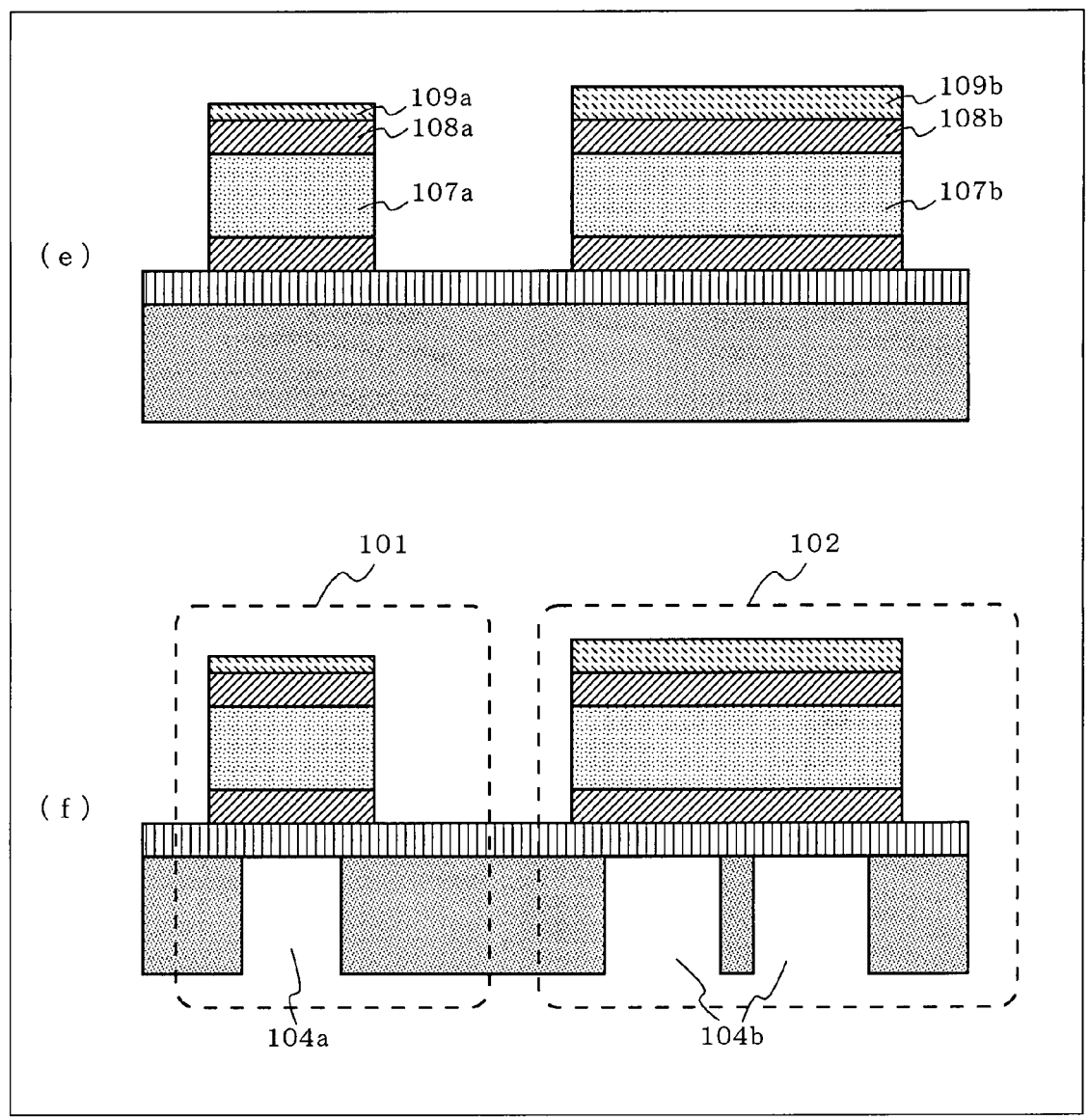

FIG. 1 is a diagram showing a structure of a piezoelectric filter 100 employing a piezoelectric resonator according to a first embodiment of the present invention. A portion (a) of FIG. 1 shows the piezoelectric filter 100 as viewed from the top. A portion (b) of FIG. 1 shows a cross-sectional view of the piezoelectric filter 100, taken along line A-A. A portion (c) of FIG. 1 shows the piezoelectric filter 100 as viewed from the bottom. FIGS. 2A and 2B are diagrams schematically showing a method for producing the piezoelectric filter 100 employing the piezoelectric resonator according to the first embodiment of the present invention.

The structure of the piezoelectric filter 100 of the first embodiment will be described in detail along with a production procedure thereof.

Initially, a substrate 103 made of silicon (Si) is prepared (portion (a) of FIG. 2A). Note that the substrate 103 may be made of glass, sapphire or the like instead of silicon. Next, a flat insulating layer 105 made of silicon oxide ($SiO_2$), silicon nitride ($Si_2N_4$) or the like is formed on the substrate 103. Further, a lower electrode layer 106 made of molybdenum (Mo), aluminum (Al), silver (Ag), tungsten (W), platinum (Pt) or the like is formed on the insulating layer 105 (portion (b) of FIG. 2A).

Next, a general photolithography technique is used to perform patterning with respect to the lower electrode layer 106 into a predetermined shape, thereby forming lower electrode layers 106a and 106b (portion (c) of FIG. 2A). For example, the lower electrode layers 106a and 106b can be formed by dissolving and removing molybdenum from an unnecessary portion using a wet etching technique (with a nitric acid-based enchant (nitric acid-sulfuric acid-water), a dry etching technique or the like.

Next, a piezoelectric material layer 107 made of aluminum nitride (AlN), an upper electrode layer 108 made of molybdenum, and a frequency adjustment layer 109 made of aluminum nitride are successively formed on the insulating layer 105 and the lower electrode layers 106a and 106b (portion (d) of FIG. 2A). For example, when a piezoelectric resonator having a 2-GHz band is formed, a thickness of the piezoelectric material layer 107 may be set to be about 1100 nm, and a thickness of the upper electrode layer 108 is set to be about 300 nm. Note that the piezoelectric material layer 107 may be made of zinc oxide (ZnO), lead zirconate titanate (PZT), lithium niobate ($LiNbO_3$), lithium tantalate ($LiTaO_3$), potassium niobate ($KNbO_3$) or the like instead of aluminum nitride. The frequency adjustment layer 109 may be made of silicon oxide, silicon nitride or the like instead of aluminum nitride.

Next, as in the lower electrode layer 106, a general lithography technique is used to perform patterning with respect to the frequency adjustment layer 109, the upper electrode layer 108, and the piezoelectric material layer 107 successively into a predetermined shape. Finally, the frequency adjustment layer 109 is etched to obtain a desired thickness (portion (e) of FIG. 2B). Thereby, a first vibration section including the lower electrode layer 106a, a piezoelectric material layer 107a, an upper electrode layer 108a, and a frequency adjustment layer 109a, and a second vibration section including the lower electrode layer 106b, a piezoelectric material layer 107b, an upper electrode layer 108b, and a frequency adjustment layer 109b, are formed. Finally, cavities 104a and 104b are formed in a bottom surface of the substrate 103 by dry etching (portion (f) of FIG. 2B).

Thus, a first piezoelectric resonator 101 including the first vibration section and the cavity 104a, and a second piezoelectric resonator 102 including the second vibration section and the cavity 104b, are formed.

In the present invention, the cavity 104b having a large opening area which is included in the second piezoelectric resonator 102 having a low impedance has the following feature.

Figure 3:
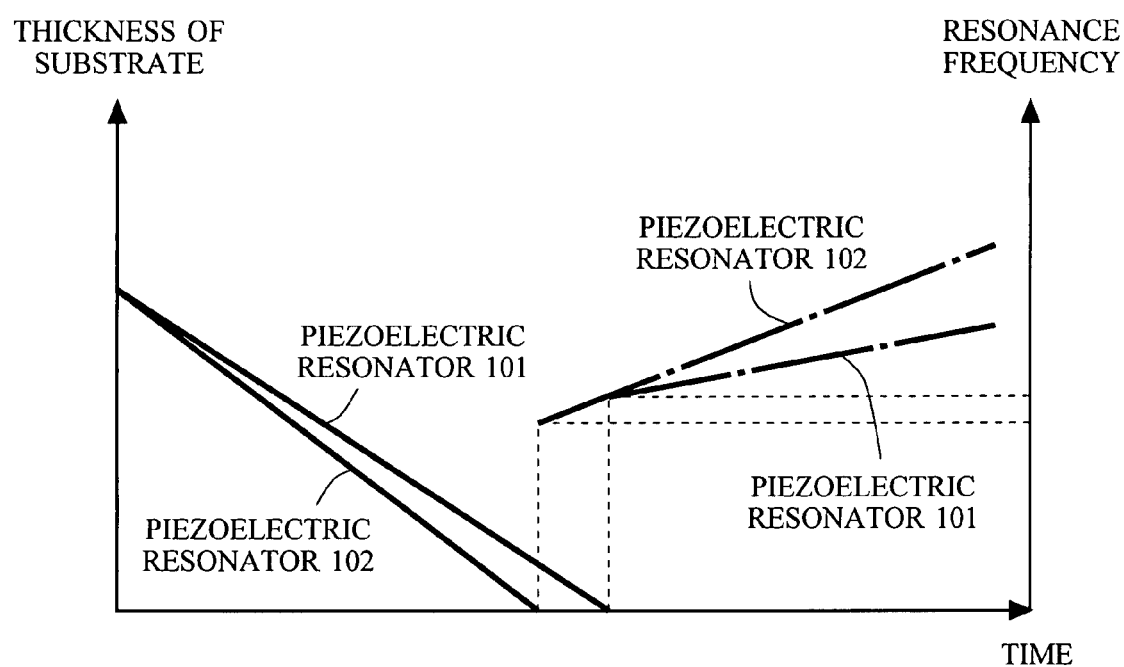
FIG. 3 is a diagram showing changes in a thickness of a substrate 103 and a resonance frequency of the piezoelectric filter 100.

The cavity 104b of the second piezoelectric resonator 102 is formed of a plurality of cells. In the example of FIG. 1, two semilunar cells having the same shape and the same dimensions (the two semilunar shapes are obtained by dividing a circle into two) are used to form the cavity 104b. When the cavity 104b is formed of a plurality of cells in this manner, an opening area per cell is reduced. Therefore, the circulation rate of reactive gas in each cell can be suppressed during an etching step for the substrate 103, thereby making it possible to eliminate or reduce an amount by which the insulating layer 105 closer to the cavity 104b is overetched, so as to secure the resonance frequency of the first piezoelectric resonator 101 having a high impedance. Since the overetching amount is eliminated or reduced, the thickness of the frequency adjustment layer 109b can be reduced. Therefore, a Q value representing the performance of the second piezoelectric resonator 102 can be improved and the insertion loss of the piezoelectric filter 100 employing the second piezoelectric resonator 102 can be reduced. FIG. 3 is a diagram showing changes in a thickness of the substrate 103 and a resonance frequency of the piezoelectric filter 100.

Note that the above-described semilunar cells are only for illustrative purposes. Various shapes, such as quadrangles, polygons, ellipses and the like, may be used. Note that a plurality of cells preferably have all the same shape and dimensions of an opening section in a surface of the substrate. In this case, the cells have the same etching rate and amount, thereby making it possible to prevent occurrence of a plurality of different resonance frequencies. In addition, since the shape of the cavity is not a circle which is vertically and horizontally symmetrical, an effect of reducing spurious (unnecessary) resonance is obtained.

Figure 4:
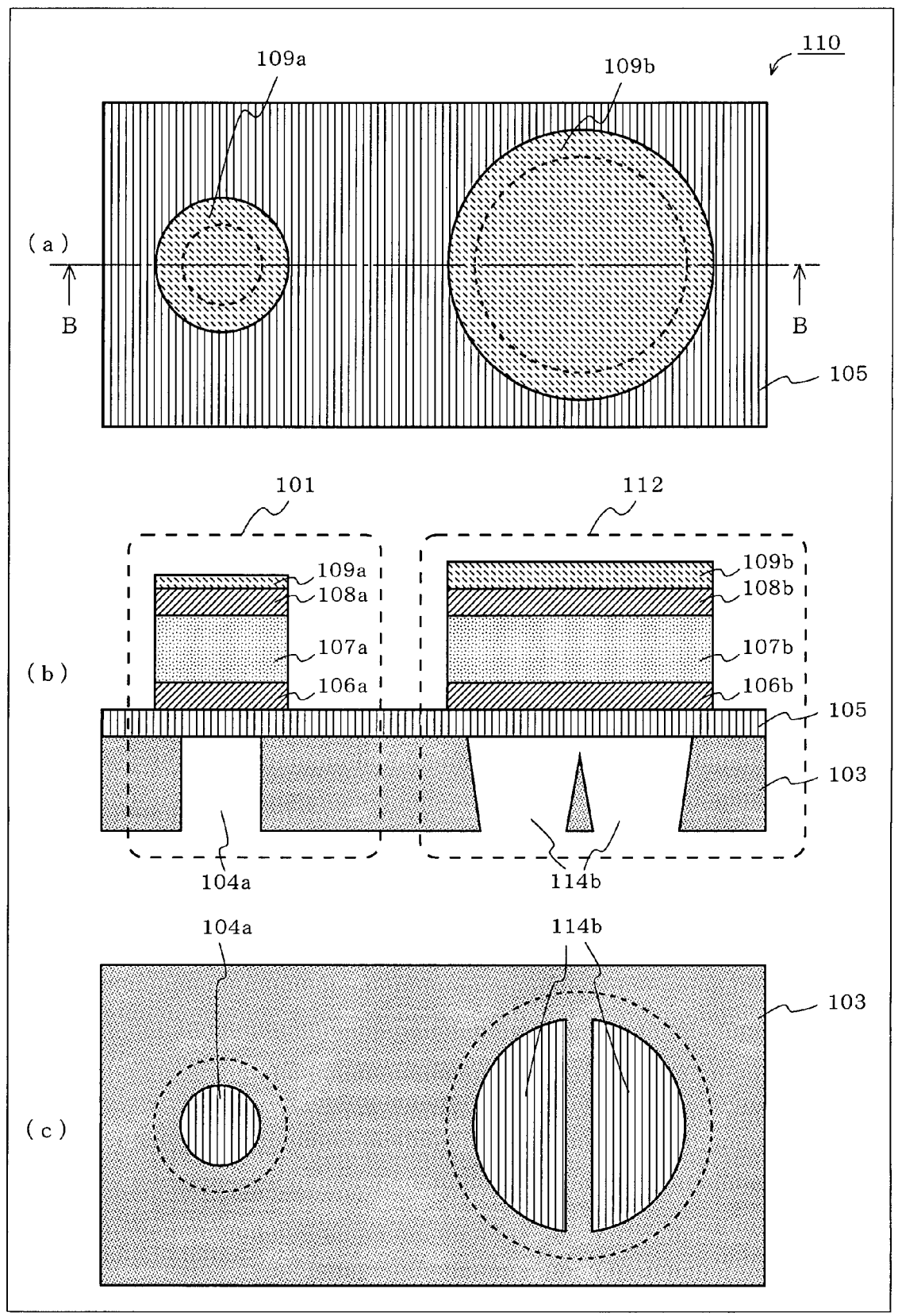
FIGS. 4 and 5A to 5D are diagrams showing structures of other piezoelectric filters 110 to 150 employing a piezoelectric resonator according to the first embodiment of the present invention.

It has also been described that the substrate 103 is dry-etched from the bottom surface so that the cavity 104b of the second piezoelectric resonator 102 obtains a vertical wall. However, as in a piezoelectric filter 110 shown in FIG. 4, the substrate 103 may be dry-etched from the bottom surface so that a cavity 114b of a piezoelectric resonator 112 obtains a wall which gradually expands from the opening portion (reverse taper). In this structure, whereas there are two semilunar shapes as viewed from the bottom surface of the substrate 103, there is a single circular cavity as viewed from the insulating layer 105. Note that a portion (a) of FIG. 4 shows the piezoelectric filter 110 as viewed from the top, a portion (b) of FIG. 4 shows a cross-sectional view of the piezoelectric filter 110, taken along line B-B, and a portion (c) of FIG. 4 shows the piezoelectric filter 110 as viewed from the bottom.

Figure 5A:
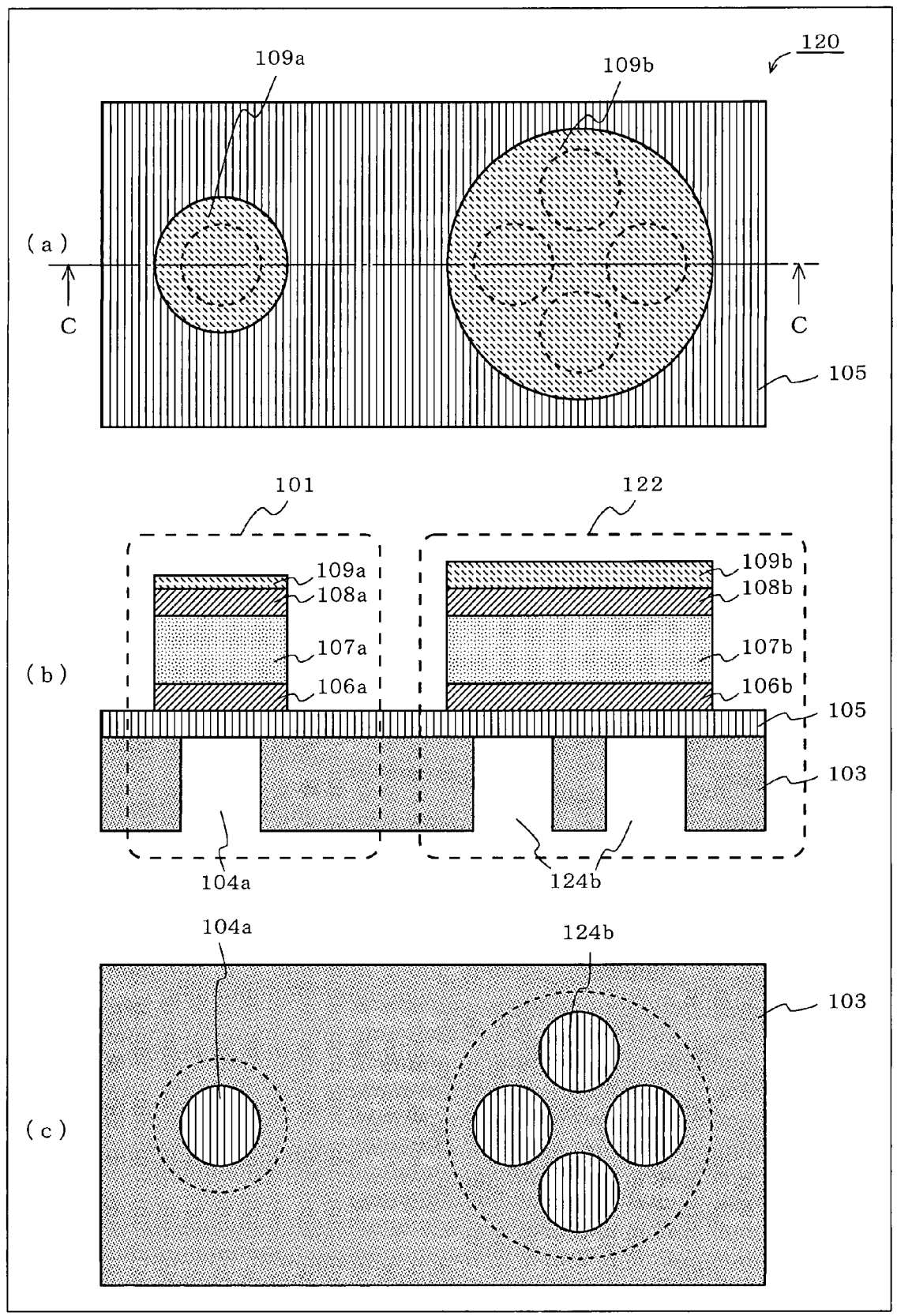
Figure 5B:
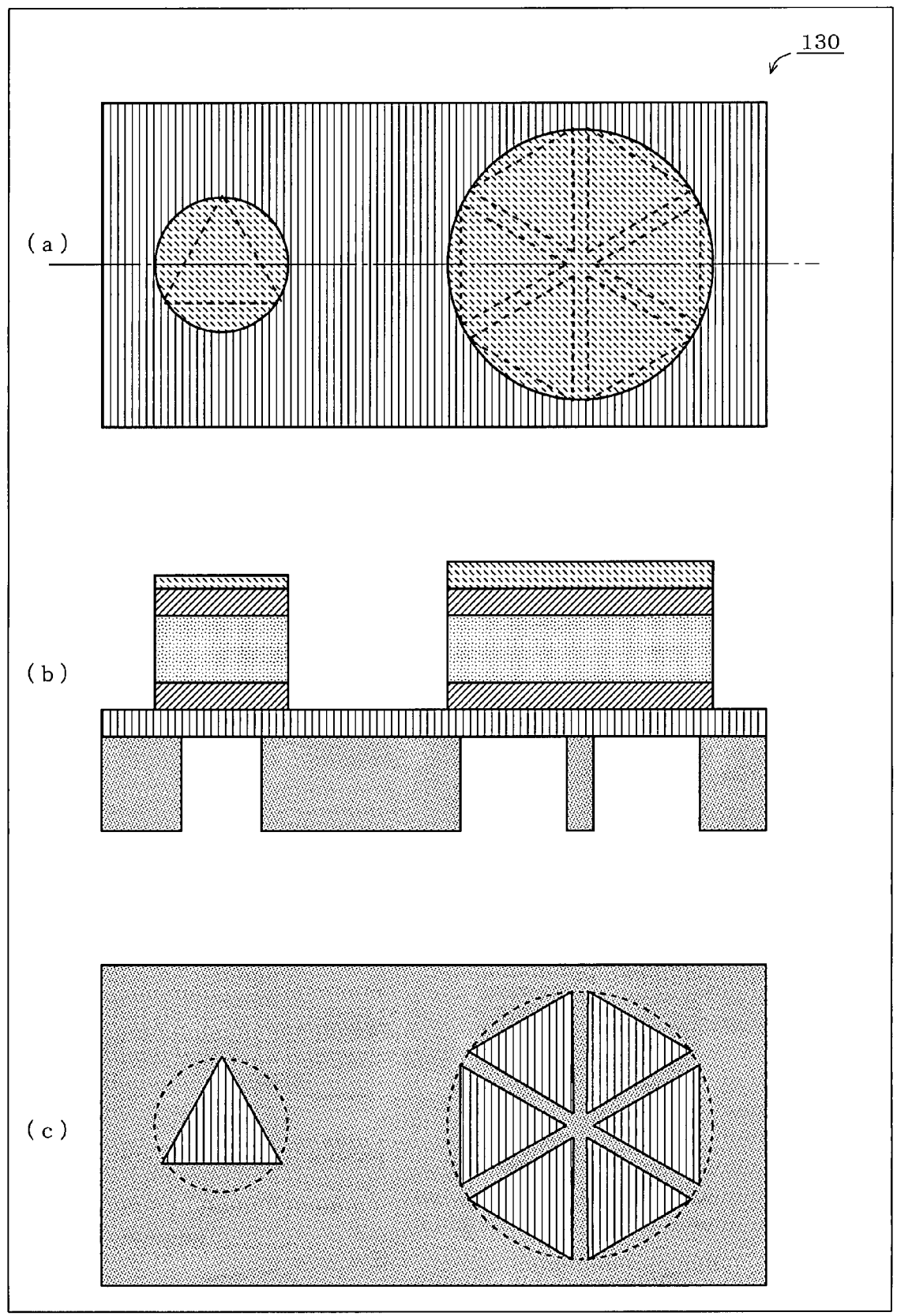
Figure 5C:
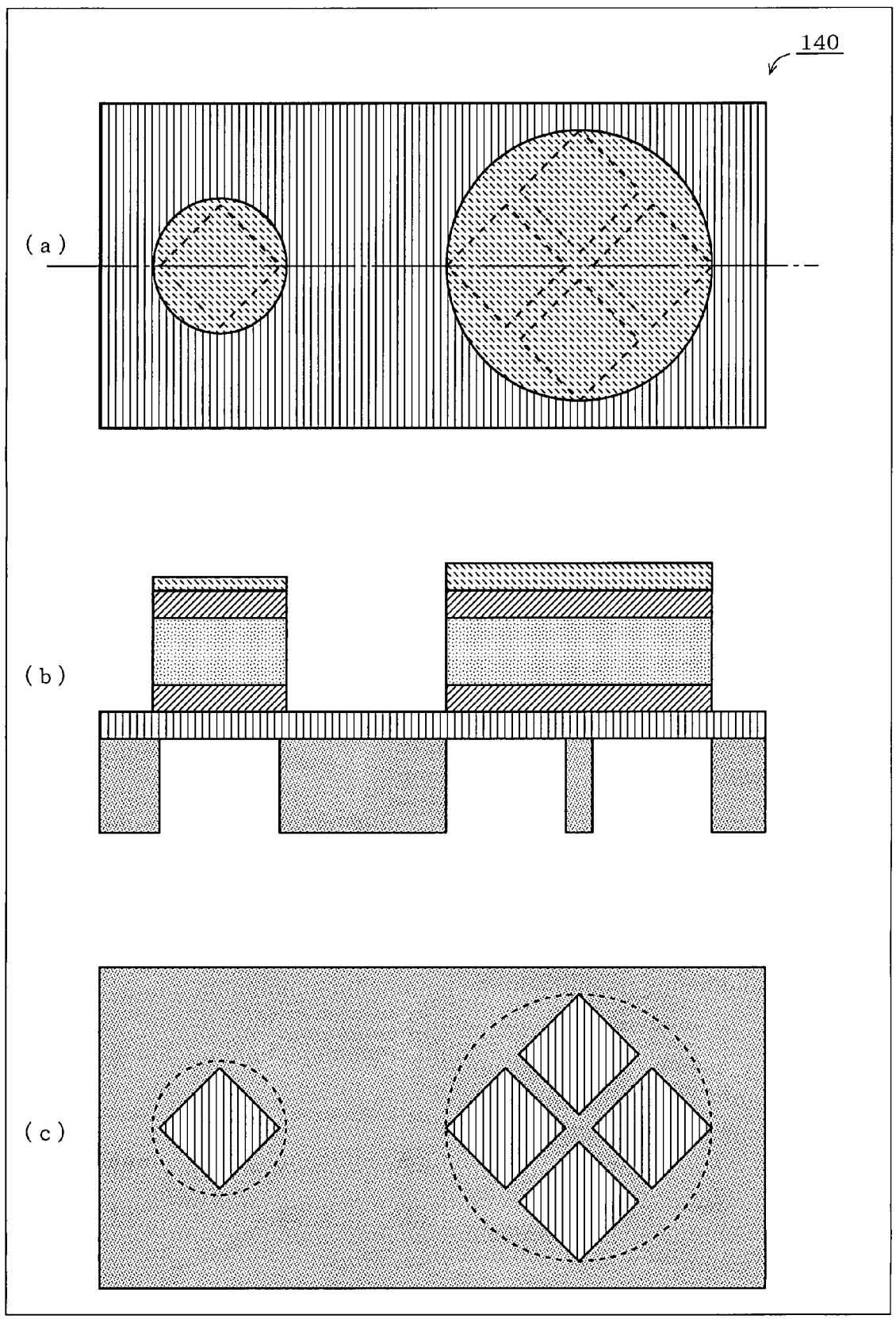
Figure 5D:
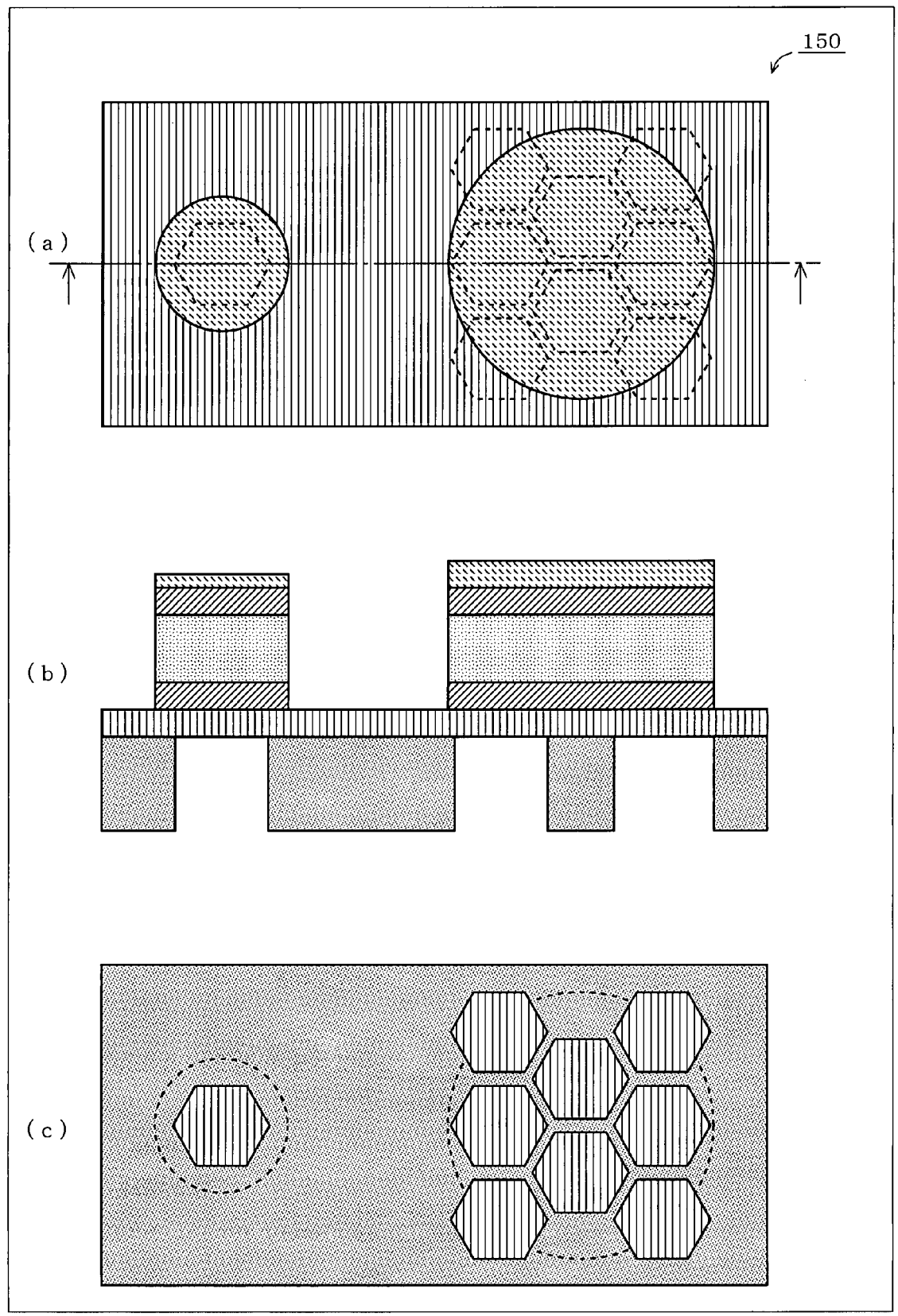
Figure 6:
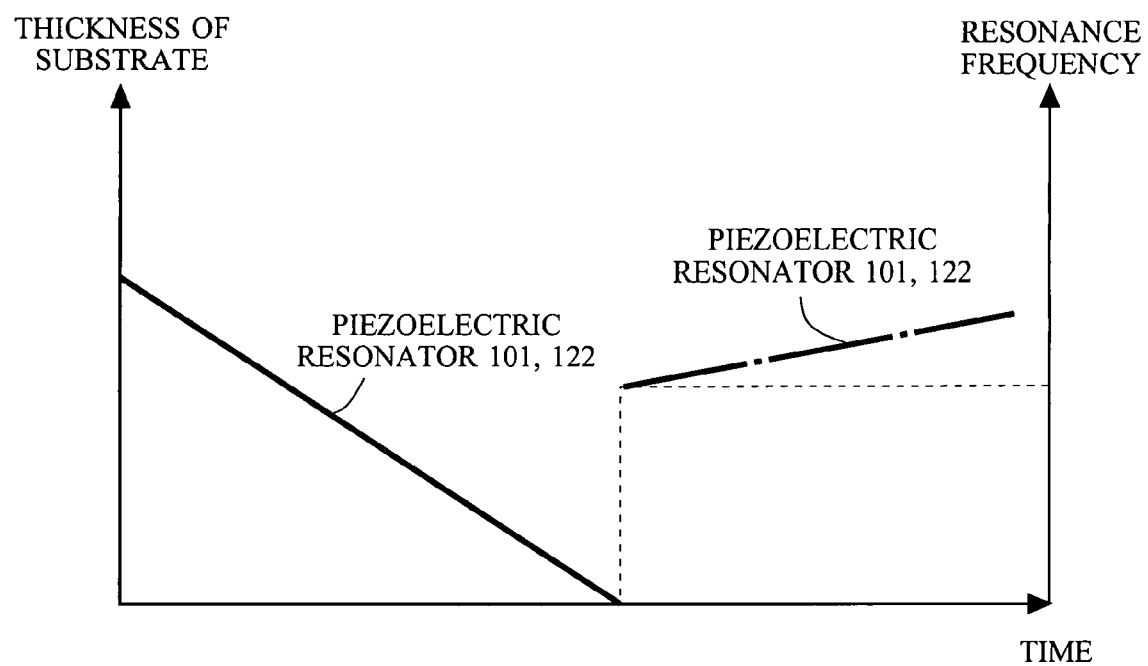
FIG. 6 is a diagram showing changes in a thickness of a substrate 103 and a resonance frequency of the piezoelectric filter 120.

Further, as in a piezoelectric filter 120 shown in FIG. 5A, a plurality of circular cells each having the same dimensions as that of the cavity 104a of the first piezoelectric resonator 101 may be provided as a cavity 124b of a second piezoelectric resonator 122. With this structure, all the cavities have the same overetching rate and amount. Therefore, it is possible to achieve piezoelectric resonators having the same resonance frequency without depending on an impedance which is designed when frequency adjustment using a frequency adjustment layer is not performed, i.e., without depending on the electrode area. Thereby, it is possible to accurately adjust the frequency adjustment layer, thereby achieving a piezoelectric resonator having a highly accurate resonance frequency. Note that a portion (a) of FIG. 5A shows the piezoelectric filter 120 as viewed from the top, a portion (b) of FIG. 5A shows a cross-sectional view of the piezoelectric filter 120, taken along line C-C, and a portion (c) of FIG. 5A shows the piezoelectric filter 120 as viewed from the bottom. FIG. 6 is a diagram showing changes in a thickness of the substrate 103 and a resonance frequency of the piezoelectric filter 120. Note that cells having other shapes may be used instead of the circular cell as long as the cells have the same dimensions, and in this case, a similar effect can be obtained (FIGS. 5B to 5D).

Second Embodiment

Figure 7:
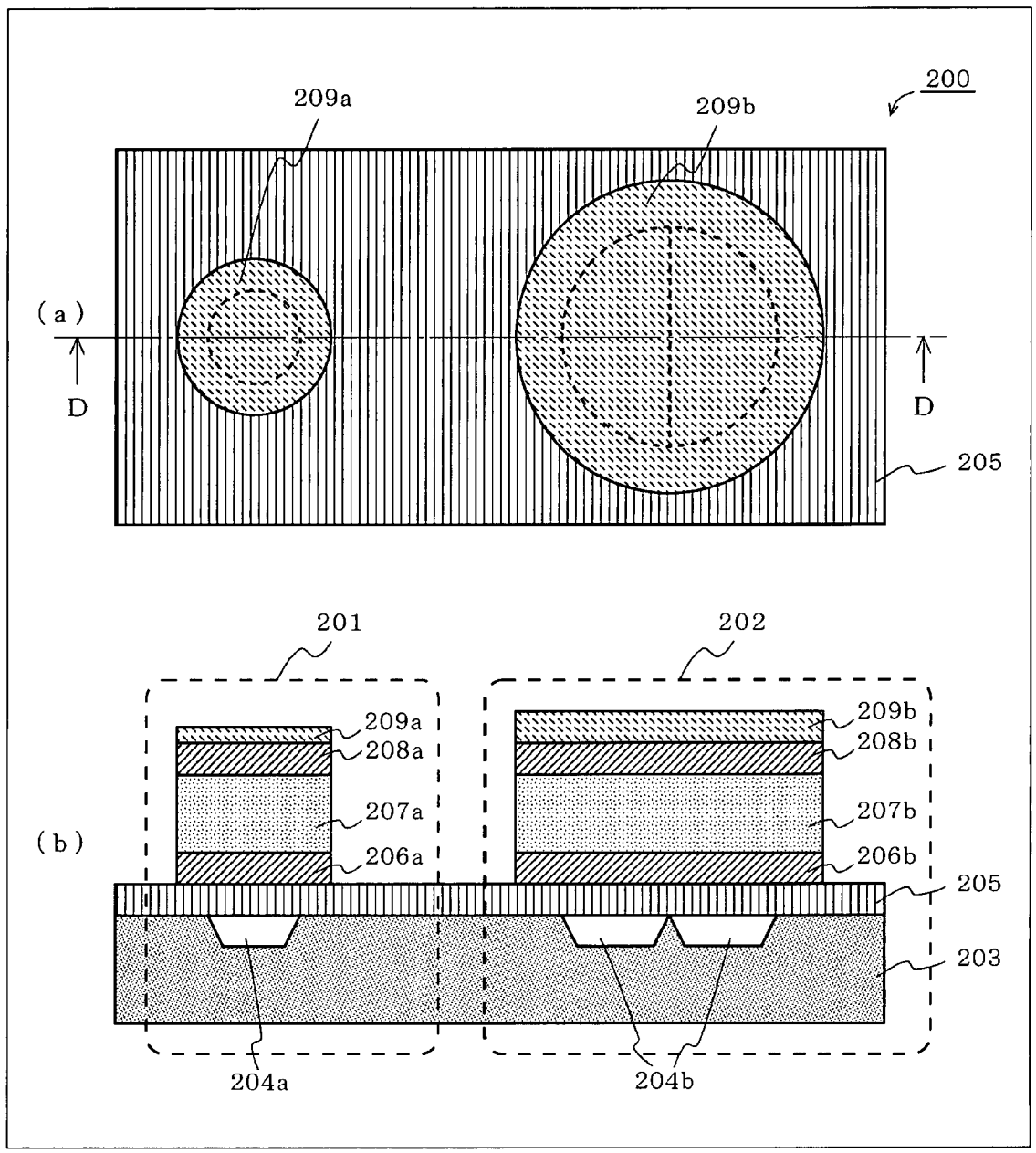
FIG. 7 is a diagram showing a structure of a piezoelectric filter 200 employing a piezoelectric resonator according to a second embodiment of the present invention.
Figure 8A:
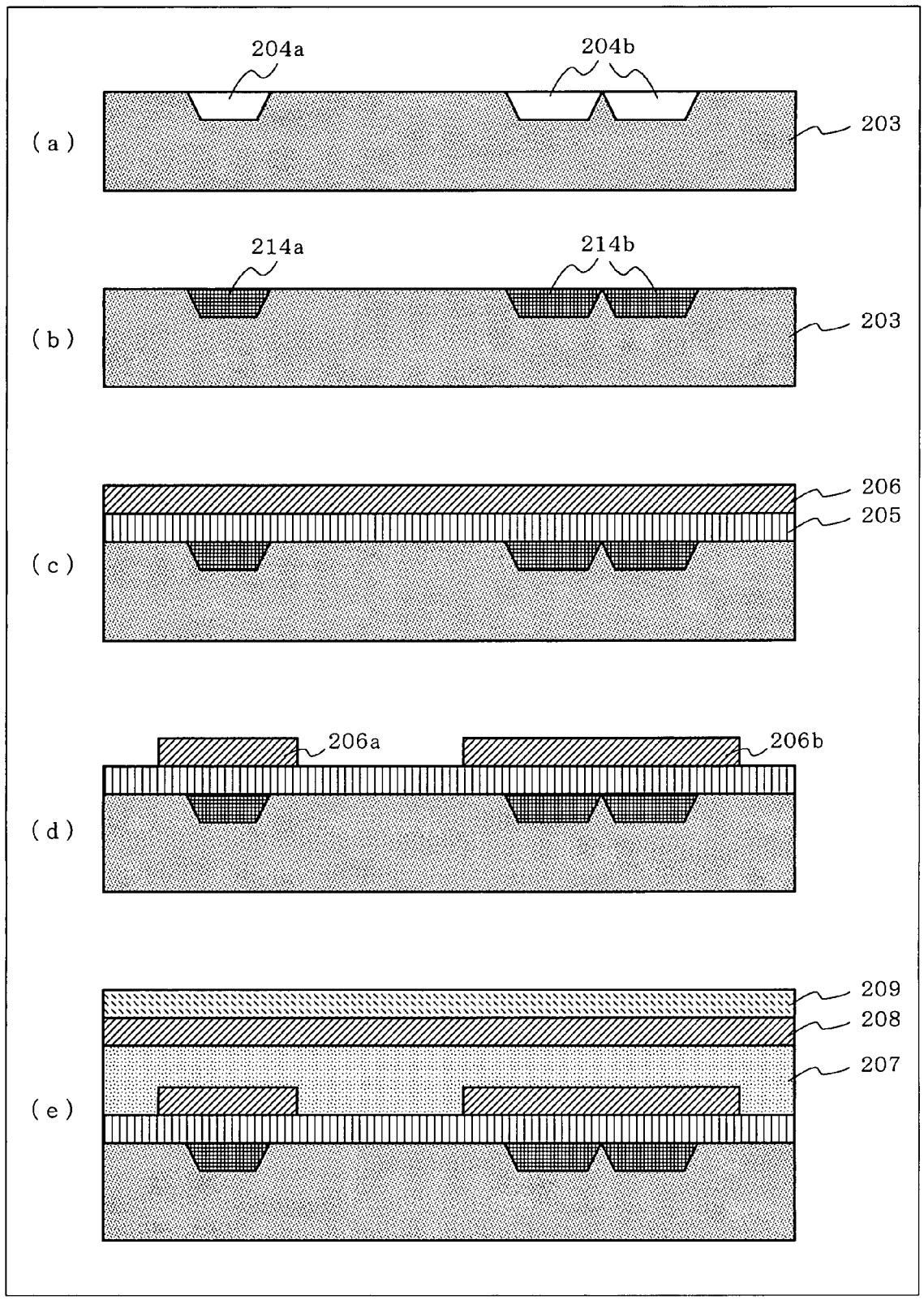
FIGS. 8A and 8B are diagrams schematically showing a method for producing the piezoelectric filter 200.
Figure 8B:
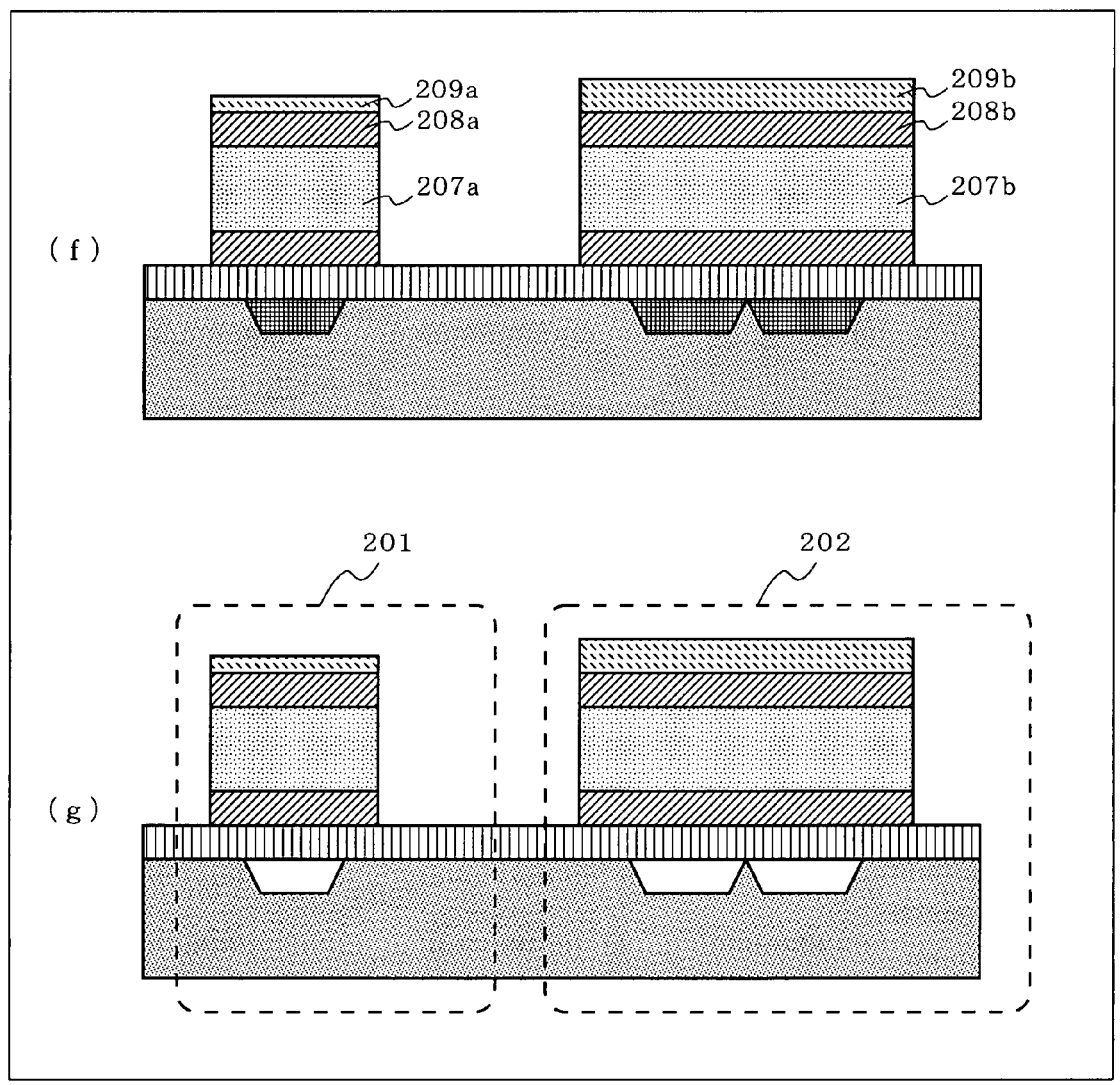

FIG. 7 is a diagram showing a cross-sectional view of a structure of a piezoelectric filter 200 employing a piezoelectric resonator according to a second embodiment of the present invention. A portion (a) of FIG. 7 shows the piezoelectric filter 200 as viewed from the top. A portion (b) of FIG. 7 shows a cross-sectional view of the piezoelectric filter 200, taken along line D-D. A portion (c) of FIG. 7 shows the piezoelectric filter 200 as viewed from the bottom. FIGS. 8A and 8B schematically show a method for producing the piezoelectric filter 200 employing the piezoelectric resonator according to the second embodiment of the present invention.

The second embodiment is different from the first embodiment in which the cavities 104a and 104b penetrating through the substrate 103 is replaced with concave cavities 204a and 204b. The concave cavity 204b included in a piezoelectric resonator 202 having a low impedance is formed of a plurality of cells as in the first embodiment.

The structure of the piezoelectric filter 200 of the second embodiment will be described along with a production procedure thereof.

Initially, a substrate 203 made of silicon is prepared. A general photolithography technique is used to dissolve and remove silicon to form the concave cavities 204a and 204b (portion (a) of FIG. 8A). Next, the concave cavities 204a and 204b are buried by forming sacrifice layers 214a and 214b made of a readily-soluble material, such as phosphosilicate glass (PSG), organic resist or the like, on the substrate 203, and thereafter, removing excesses of the sacrifice layers 214a and 214b extending out of the concave cavities 204a and 204b by CMP or the like to flatten surfaces thereof (portion (b) of FIG. 8A). Next, a flat insulating layer 205 made of silicon oxide, silicon nitride or the like is formed on the substrate 203. Further, a lower electrode layer 206 made of molybdenum, aluminum, silver, tungsten, platinum or the like is formed on the insulating layer 205 (portion (c) of FIG. 8A).

Next, a general photolithography technique is used to perform patterning with respect to the lower electrode layer 206 into a predetermined shape, thereby forming lower electrode layers 206a and 206b (portion (d) of FIG. 8A). Next, a piezoelectric material layer 207 made of aluminum nitride, an upper electrode layer 208 made of molybdenum, and a frequency adjustment layer 209 made of aluminum nitride are successively formed on the insulating layer 205 and the lower electrode layer 206a and 206b (portion (e) of FIG. 8A). Next, as in the lower electrode layer 206, a general photolithography technique is used to perform patterning with respect to the frequency adjustment layer 209, the upper electrode layer 208, and the piezoelectric material layer 207 successively into a predetermined shape, so that portions of the sacrifice layers 214a and 214b are exposed. Further, the frequency adjustment layer 209 is etched to obtain a desired film thickness (portion (f) of FIG. 8B). Finally, the sacrifice layers 214a and 214b formed in the concave cavities 204a and 204b are removed by etching using a solvent, such as hydrofluoric acid, an organic solvent or the like to form the concave cavities 204a and 204b again. Thus, piezoelectric resonators 201 and 202 are formed (portion (g) of FIG. 8B).

Thus, a first vibration section including the lower electrode layer 206a, a piezoelectric material layer 207a, an upper electrode layer 208a, and a frequency adjustment layer 209a, and a second vibration section including the lower electrode layer 206b, a piezoelectric material layer 207b, an upper electrode layer 208b, and a frequency adjustment layer 209b, are formed.

The concave cavity 204b having a large opening area, which is included in the second piezoelectric resonator 202 having a low impedance, is formed of a plurality of cells, so that the circulation rate of reactive gas in each cell can be suppressed during the step of etching the sacrifice layers 214a and 214b. Thereby, it is possible to eliminate or reduce the overetching amount of the insulating layer 205 on the concave cavity 204b so as to secure the resonance frequency of the first piezoelectric resonator 201 having a high impedance. Since the overetching amount is eliminated or reduced, the thickness of the frequency adjustment layer 209b can be reduced. Therefore, a Q value representing the performance of the second piezoelectric resonator 202 can be improved and the insertion loss of the piezoelectric filter 200 employing the second piezoelectric resonator 202 can be reduced.

(Exemplary Communications Apparatus Employing Piezoelectric Filter)

Figure 9:
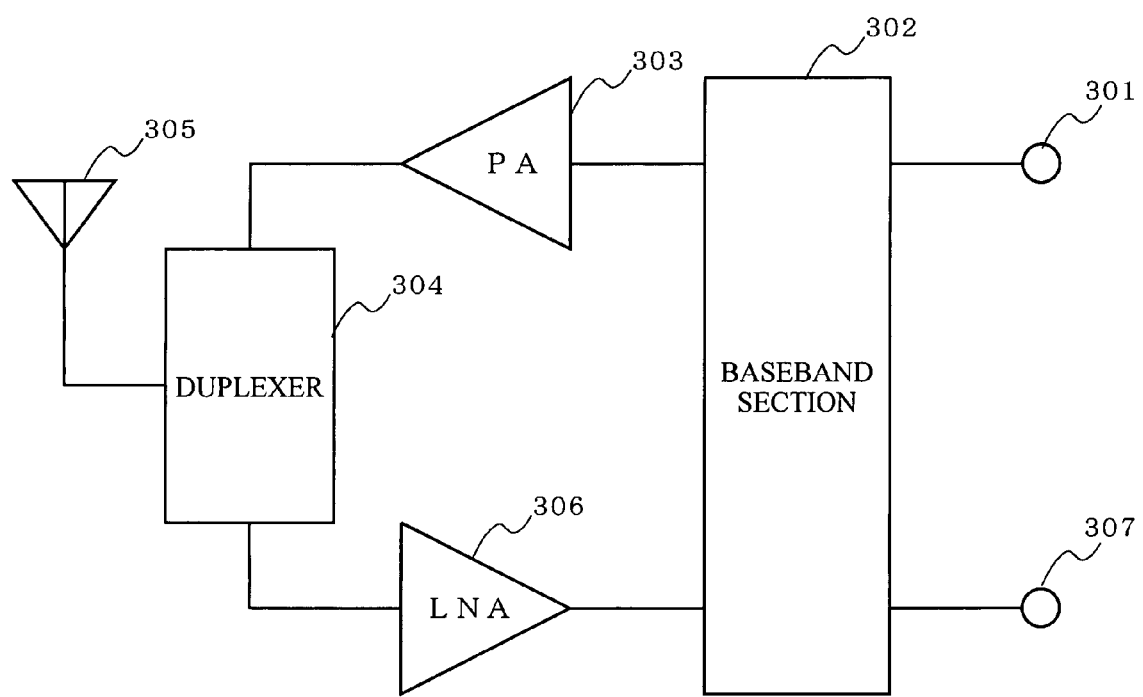
FIG. 9 is a diagram showing an exemplary configuration of a communications apparatus employing the piezoelectric filter 100 or 200.
Figure 10:
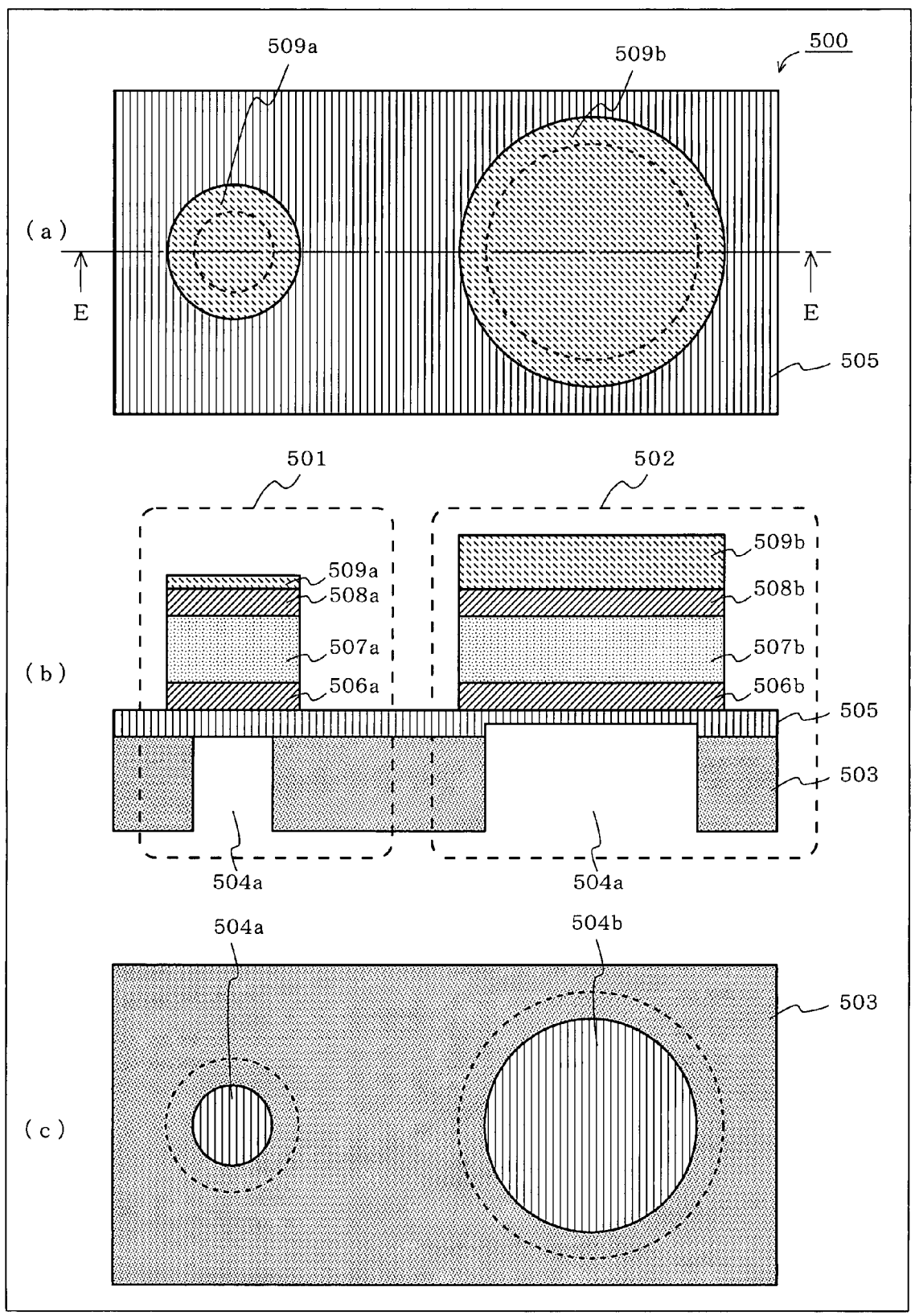
FIG. 10 is a diagram showing an exemplary structure of a conventional piezoelectric filter 500 employing a piezoelectric resonator.
Figure 11:
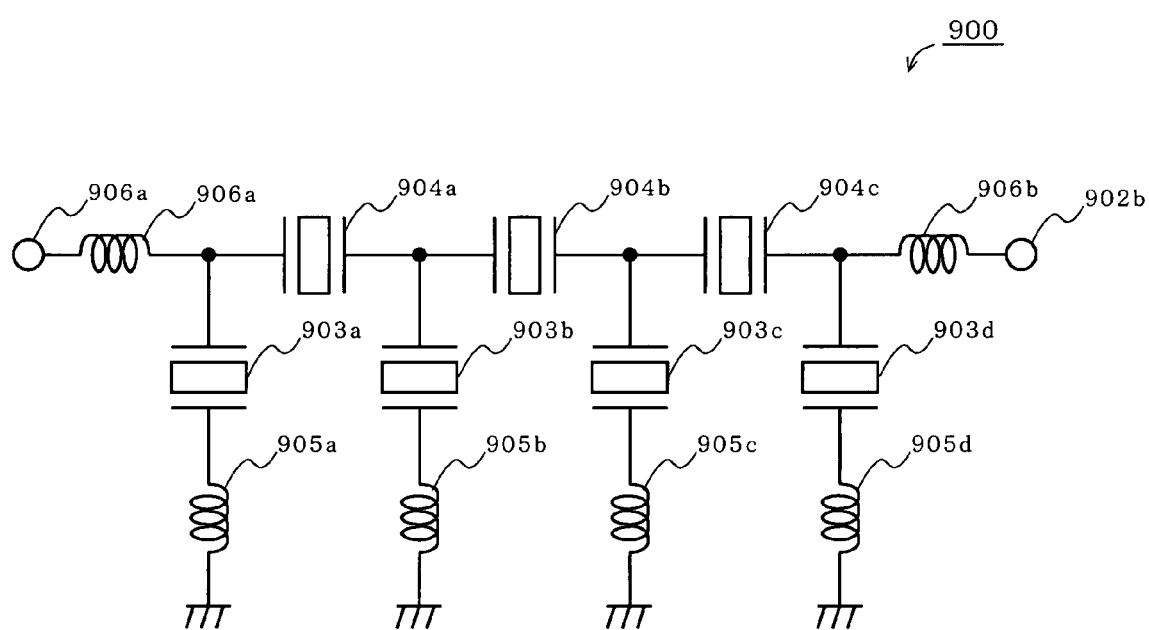
FIG. 11 is a diagram showing an exemplary conventional piezoelectric filter circuit 900 employing a piezoelectric resonator.
Figure 12:
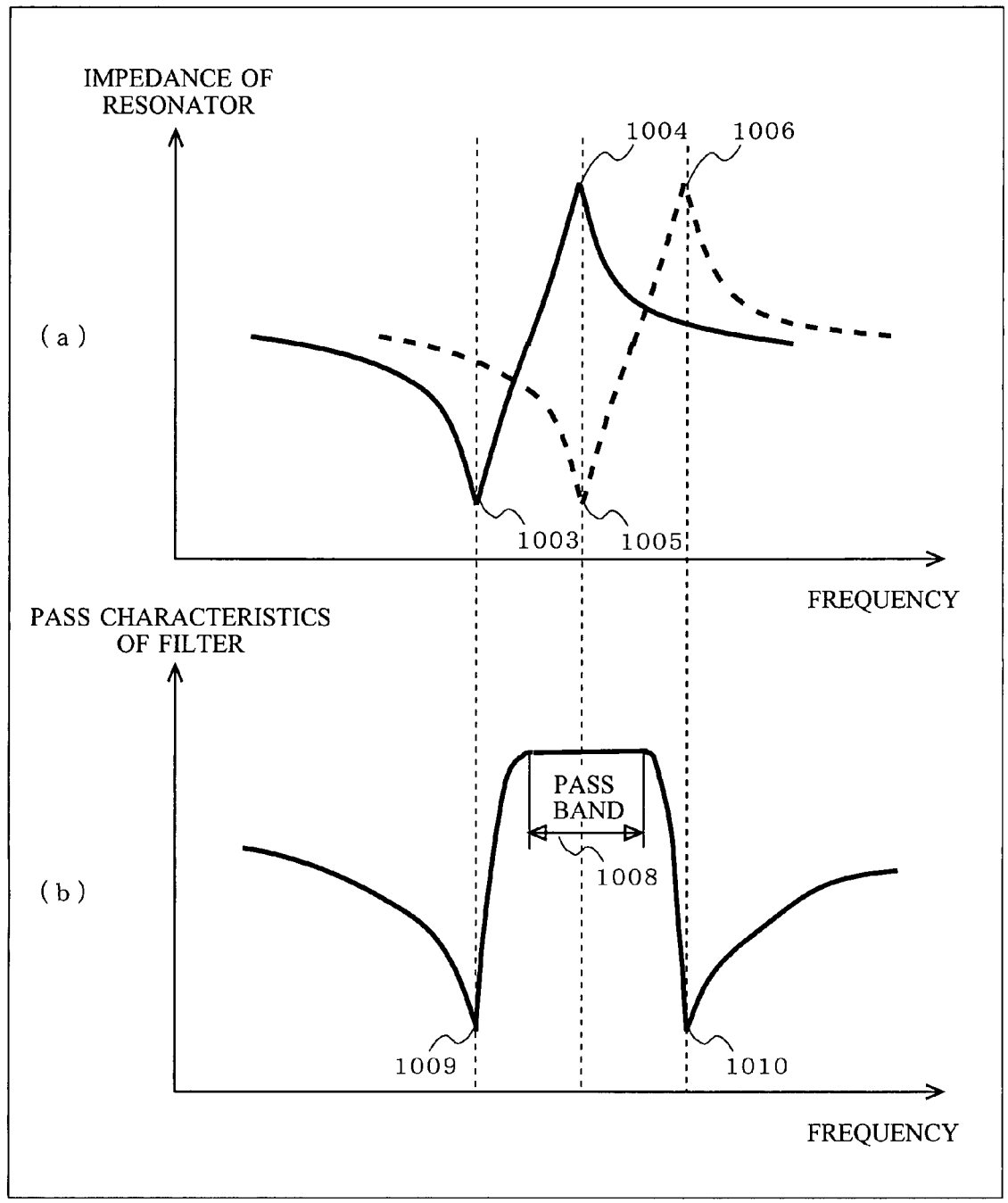
FIG. 12 is a diagram showing characteristics of a conventional piezoelectric resonator when used singly, and pass characteristics of a conventional piezoelectric filter.

FIG. 9 is a diagram showing an exemplary configuration of a communications apparatus employing the piezoelectric filter 100 or 200 which has been described in the first or second embodiment above. The communications apparatus comprises a baseband section 302, a power amplifier (PA) 303, an antenna duplexer 304, an antenna 305, and a low-noise amplifier (LNA) 306.

A signal input to a transmission terminal 301 is passed through the baseband section 302, is amplified by the power amplifier 303, is subjected to filtering by the antenna duplexer 304, and is transmitted with radio waves from the antenna 305. A signal received by the antenna 305 is subjected to filtering by the antenna duplexer 304, is amplified by the low-noise amplifier 306, and is passed and transferred through the baseband section 302 to a reception terminal 307. If the piezoelectric filter 100 or 200 described in the first and second embodiments is employed in the antenna duplexer 304, the communications apparatus can exhibit the useful effect of the present invention. Note that, if the piezoelectric filter 100 or 200 is employed as at least one of a transmission filter and a reception filter included in an antenna duplexer, the insertion loss of the antenna duplexer can be reduced.

While the invention has been described in detail, the foregoing description is in all aspects illustrative and not restrictive. It is understood that numerous other modifications and variations can be devised without departing from the scope of the invention.

What is claimed is:

1. A piezoelectric filter comprising:
   a substrate; and
   a plurality of piezoelectric resonators provided on the same said substrate, wherein said plurality of piezoelectric resonators each comprises:
      a cavity formed in said substrate;
      a lower electrode formed on said substrate, covering said cavity;
      a piezoelectric material layer formed on said lower electrode; and
      an upper electrode formed on said piezoelectric material layer, and
      at least one of said plurality of piezoelectric resonators has a cavity formed of two semilunar cells that have the same shape obtained by dividing a circle into two and are arranged axisymmetrically.

2. The piezoelectric filter according to claim 1, wherein said at least one of the plurality of piezoelectric resonators having the cavity formed of the two semilunar cells has a lower impedance than that of another piezoelectric resonator.

3. The piezoelectric filter according to claim 1, wherein each said cavity penetrates through said substrate.

4. The piezoelectric filter according to claim 3, wherein the two semilunar cells are connected to each other in a surface closer to the lower electrode.

5. An antenna duplexer, wherein the piezoelectric filter according to claim 1 is employed as at least one of a transmission filter and a reception filter.

6. A communications apparatus comprising:
   an antenna;
   a transmission device;
   a reception device; and
   the antenna duplexer according to claim 5 provided between said antenna, and said transmission device and said reception device.

* * * * *